(12) United States Patent
Romalis et al.

(10) Patent No.: US 10,852,371 B2
(45) Date of Patent: Dec. 1, 2020

(54) PULSED SCALAR ATOMIC MAGNETOMETER

(71) Applicants: The Trustees of Princeton University, Princeton, NJ (US); Michael Romalis, Princeton, NJ (US); Haifeng Dong, Beijing (CN); Andrei Baranga, Omer (IL)

(72) Inventors: Michael Romalis, Princeton, NJ (US); Haifeng Dong, Beijing (CN); Andrei Baranga, Omer (IL)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 257 days.

(21) Appl. No.: 15/780,322

(22) PCT Filed: Dec. 1, 2016

(86) PCT No.: PCT/US2016/064346
§ 371 (c)(1),
(2) Date: May 31, 2018

(87) PCT Pub. No.: WO2017/095998
PCT Pub. Date: Jun. 8, 2017

(65) Prior Publication Data
US 2018/0356476 A1    Dec. 13, 2018

Related U.S. Application Data

(60) Provisional application No. 62/262,095, filed on Dec. 2, 2015.

(51) Int. Cl.
*G01R 33/26* (2006.01)
*G01R 33/032* (2006.01)
*G01R 33/02* (2006.01)

(52) U.S. Cl.
CPC ............ *G01R 33/26* (2013.01); *G01R 33/02* (2013.01); *G01R 33/032* (2013.01)

(58) Field of Classification Search
CPC ....... G01R 33/26; G01R 33/02; G01R 33/032
See application file for complete search history.

(56) References Cited

U.S. PATENT DOCUMENTS

| | | | |
|---|---|---|---|
| 5,642,046 A | 6/1997 | Hawks | |
| 7,038,450 B2 * | 5/2006 | Romalis | G01R 33/02 324/301 |
| 7,102,451 B2 | 9/2006 | Happer et al. | |
| 7,145,333 B2 * | 12/2006 | Romalis | G01R 33/02 324/304 |

(Continued)

OTHER PUBLICATIONS

International Search Report and Written Opinion for PCT/US2016/064346, dated Feb. 21, 2017.

*Primary Examiner* — Dixomara Vargas
(74) *Attorney, Agent, or Firm* — Meagher Emanuel Laks Goldberg & Liao, LLP

(57) ABSTRACT

Disclosed is a method and apparatus relating generally to scalar atomic magnetometers. The disclosed methods and apparatus utilize a pressurized sample chamber and a high frequency pulsed pump laser to increase spin polarization and significantly suppress heading errors. These methods and apparatus may also include alternating polarization of the pump light between pulses.

18 Claims, 9 Drawing Sheets

(56) References Cited

U.S. PATENT DOCUMENTS

| | | | |
|---|---|---|---|
| 7,521,928 B2* | 4/2009 | Romalis | G01R 33/24 324/301 |
| 7,826,065 B1* | 11/2010 | Okandan | G01B 11/02 324/244.1 |
| 8,212,556 B1* | 7/2012 | Schwindt | G01R 33/26 324/301 |
| 8,421,455 B1 | 4/2013 | Hovde et al. | |
| 8,941,377 B2* | 1/2015 | Mizutani | G01R 33/032 324/244.1 |
| 9,244,137 B2* | 1/2016 | Kobayashi | G01R 33/26 |
| 9,857,441 B2* | 1/2018 | Salit | G01R 33/26 |
| 9,927,501 B2* | 3/2018 | Kim | G01R 33/26 |
| 9,964,609 B2* | 5/2018 | Ichihara | G01R 33/26 |
| 9,995,800 B1* | 6/2018 | Schwindt | G01R 33/26 |
| 10,288,701 B2* | 5/2019 | Kobayashi | G01R 33/26 |
| 2004/0140799 A1* | 7/2004 | Romalis | G01R 33/02 324/301 |
| 2004/0233003 A1* | 11/2004 | Happer | G04F 5/14 331/94.1 |
| 2005/0206377 A1* | 9/2005 | Romalis | G01R 33/02 324/301 |
| 2008/0106261 A1* | 5/2008 | Romalis | G01R 33/441 324/304 |
| 2010/0090697 A1* | 4/2010 | Savukov | G01R 33/26 324/309 |
| 2012/0112749 A1 | 5/2012 | Budker et al. | |
| 2013/0082700 A1* | 4/2013 | Mizutani | G01R 33/26 324/301 |
| 2013/0082701 A1* | 4/2013 | Mizutani | G01R 33/323 324/301 |
| 2013/0278253 A1* | 10/2013 | Ichihara | G01R 33/26 324/304 |
| 2014/0097837 A1* | 4/2014 | Takahashi | A61B 5/04008 324/301 |
| 2014/0320123 A1* | 10/2014 | Kobayashi | G01R 33/26 324/244.1 |
| 2014/0375313 A1* | 12/2014 | Salit | G01R 33/032 324/301 |
| 2015/0022200 A1* | 1/2015 | Ichihara | G01R 33/26 324/304 |
| 2015/0054504 A1* | 2/2015 | Ichihara | G01R 33/26 324/305 |
| 2015/0316625 A1* | 11/2015 | Bulatowicz | G01R 33/3875 324/304 |
| 2015/0377989 A1 | 12/2015 | Ben Amar Baranga et al. | |
| 2016/0061913 A1* | 3/2016 | Kobayashi | G01R 33/26 324/305 |
| 2016/0116553 A1* | 4/2016 | Kim | G01R 33/26 324/305 |
| 2017/0023653 A1* | 1/2017 | Kobayashi | G01R 33/26 |
| 2017/0023654 A1* | 1/2017 | Kobayashi | G01R 33/26 |

* cited by examiner

PULSED SCALAR ATOMIC MAGNETOMETER

CROSS-REFERENCE TO RELATED APPLICATIONS

This application claims the benefit of U.S. Provisional Application No. 62/262,095, filed Dec. 2, 2015, which is hereby incorporated in its entirety by reference.

STATEMENT REGARDING FEDERALLY SPONSORED RESEARCH OR DEVELOPMENT

This invention was made with government support under Grant No. N00014-13-P-1162 and Grant No. N00014-14-C-0326 awarded by the United States Office of Naval Research. The government has certain rights in the invention.

BACKGROUND OF THE INVENTION

Scalar atomic magnetometers are widely used for measurements of geological magnetic fields. They are typically operated in a continuous regime, where a pump laser or resonance lamp is used to maintain a constant atomic spin polarization. In such operation the optimal intensity of the pump laser creates spin polarization of approximately 50%. If the pump laser intensity is too high, it broadens the magnetic resonance linewidth. If the pump laser intensity is too low, it reduces the size of the signal. The equilibrium spin polarization of the atoms depends on the precise value of the laser intensity, on the relative orientation between the pump laser and the magnetic field, and on the spin relaxation of the atoms.

Atomic magnetometers using alkali metal atoms suffer from heading errors due to non-linear Zeeman splitting. There are several resonance lines and the relative strength of the resonance lines depends on spin polarization. As a result, as the equilibrium polarization of the atoms changes due to changes in the heading of the sensor relative to the magnetic field or due to changes in other parameters, the average frequency of spin precession changes as well, causing false apparent changes in the magnetic field.

Thus, there is a need for a scalar atomic magnetometer that can increase spin polarization and minimize heading errors without losing sensitivity, accuracy, or resolution.

BRIEF SUMMARY OF THE INVENTION

A magnetometer is disclosed. The magnetometer includes a sample medium within a sample chamber. The sample medium is composed of an alkali metal vapor and a quenching gas at a pressure sufficiently high to enable spin polarization of alkali metal atoms to be greater than or equal to a predetermined level. The magnetometer may also include a pump laser having a sufficiently high intensity so as to polarize atoms within the sample medium on a time scale shorter than their Larmor precession period.

The magnetometer may include a probe laser configured to produce a probe light directed towards the sample chamber, and at least a portion of the pump light and at least a portion of the probe light may be collinear.

The magnetometer may also be configured to pressurize the sample medium to enable spin polarization to be 95% or greater. The sample medium may be optically thick. The pump laser may be configured to propagate at least three optical lengths into the sample medium.

The pump laser may be adapted to produce a plurality of pulses of at least one of $\sigma^+$ or $\sigma^-$ pump light, wherein the duration of each pulse is shorter than the Larmor spin precession period. The pump laser may alternate the polarization of the pump laser between successive pulses, and the pulses may be produced at a rate synchronous with repetitive magnetic field noise, such as 16.7 Hz, 25 Hz, 50 Hz, 60 Hz, or 400 Hz.

Also disclosed is a method for measuring magnetic fields, involving introducing a quenching gas at a pressure sufficiently high to enable spin polarization of alkali metal atoms to be greater than or equal to a predetermined level, optically pumping alkali metal atoms using pulses of at least one of $\sigma^+$ or $\sigma^-$ pump light, the duration of each pulse being shorter than the Larmor period, and monitoring precession of spin of the alkali metal atoms with a probe laser for a time on the order of the spin-relaxation time.

The quenching gas may be introduced at a pressure greater than approximately 100 torr, and the pressure may be set so as to enable spin polarization of alkali metal atoms to be greater than or equal to a value of 95% or greater.

The method may also involve passing each pulse through a sample chamber containing the alkali metal vapor, wherein the sample chamber is configured such that the pump light propagates through the alkali metal vapor a sufficient number of optical lengths—perhaps 3 or more—so as to allow at least some purification of circular polarization.

The method may also involve alternating the polarization of the pump laser between successive pulses.

The method may also involve monitoring the precession of spins with a probe laser for a period of time, such as approximately the spin-relaxation time, and generating a spin-procession signal. The method may also involve determining the frequency of the spin procession signal by non-linear fitting the signal to a decaying sine wave.

DETAILED DESCRIPTION OF THE INVENTION

Disclosed herein is a magnetometer. Specifically, disclosed is a pulsed scalar atomic magnetometer that utilizes a pressurized sample medium and a pulsed laser light having very short pulse durations in order to increase spin polarization and minimize heading errors without losing sensitivity, accuracy, or resolution.

Figure 1:
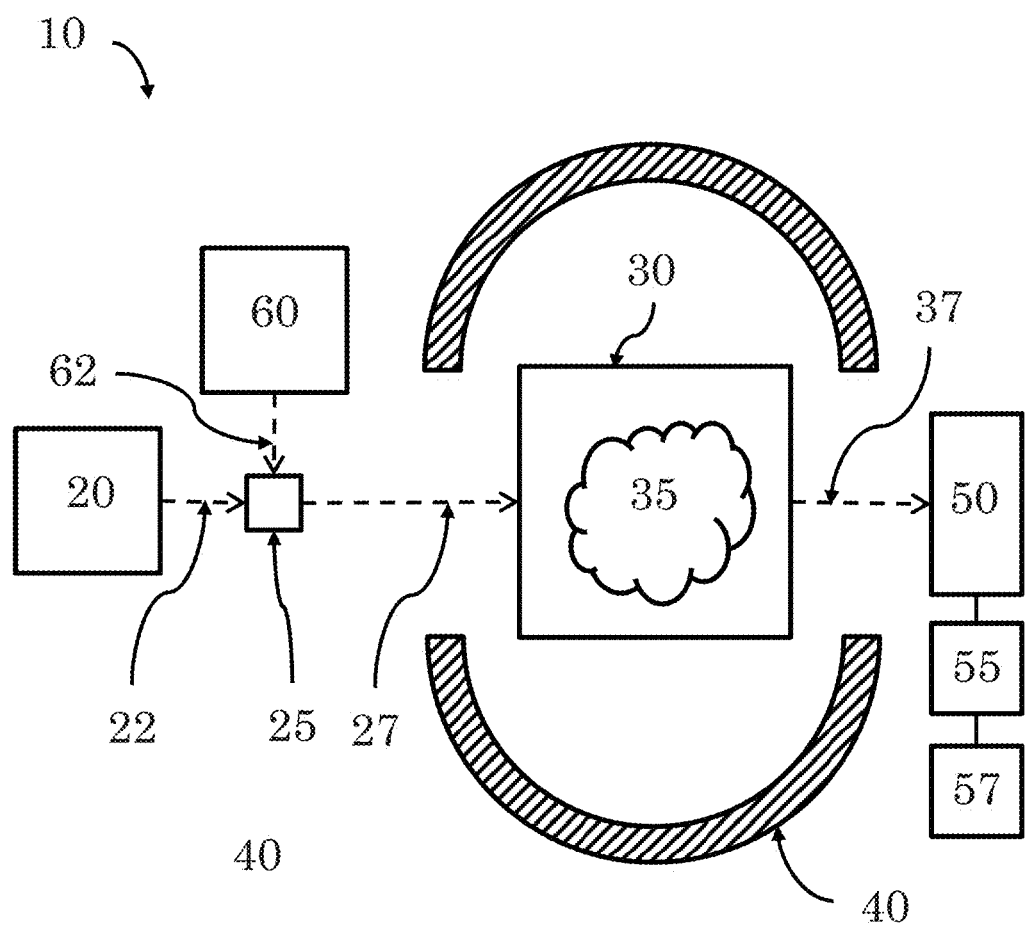
FIG. 1 is a depiction of a magnetometer.

Referring to FIG. 1, a preferred embodiment of a magnetometer (10) generally comprises a sample medium (35) within a sample chamber (30). The sample chamber may be enclosed within RF coils (40). The sample medium comprises an alkali metal vapor and a quenching gas. The quenching gas is typically a diatomic molecule such as, but not limited to, $N_2$. The magnetometer (10) also comprises a pump laser (20). The output of the pump laser (22) is directed towards the sample chamber (30). If the magnetometer also comprises a separate probe laser (60), the output from the probe laser (62) may also be directed towards the sample chamber (30), utilizing various techniques known in the industry, such as a beam splitter/combiner (25), which may also allow at least a portion (27) of the output from the pump laser (20) and/or probe laser (60) to be collinear.

The type of device used to generate a laser is not particularly limited, and may include diode lasers.

The quenching gas should be used at a pressure sufficiently high to enable spin polarization of alkali metal atoms to be greater than or equal to a predetermined level. Preferably, that predetermined level is 70% or greater. More preferably, it is 90% or greater. Still more preferably it is 95% or greater, and even more preferably, it is 98% or greater.

Figure 2:
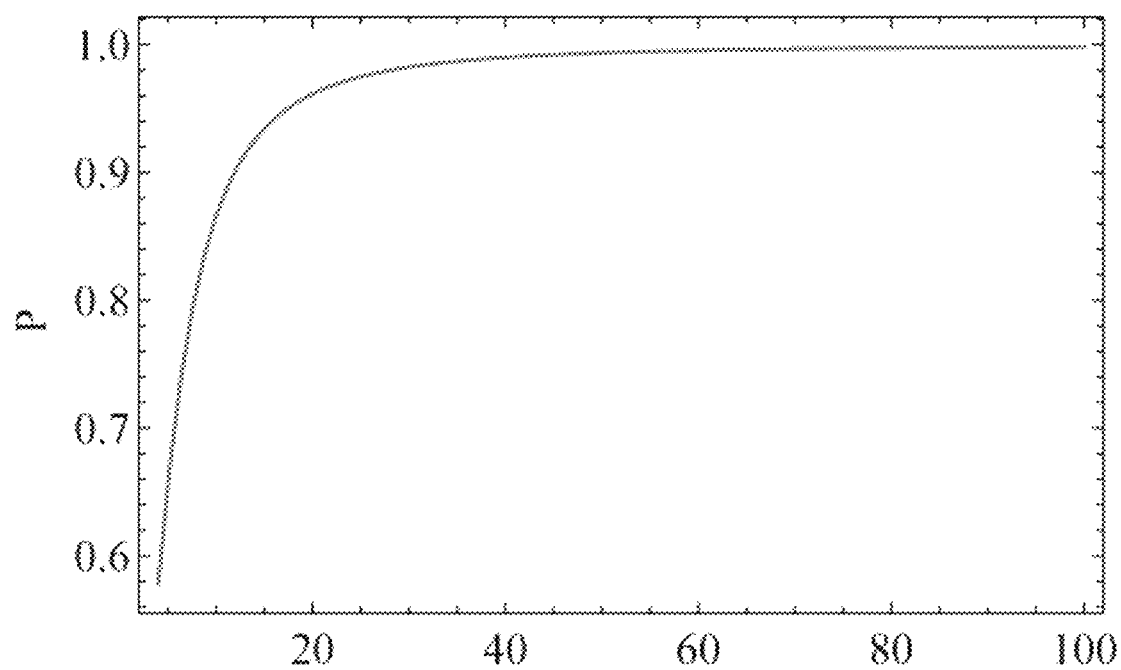
FIG. 2 is a graph depicting the polarization of atoms P as a function of the ratio of the pumping rate to the Larmor precession frequency.

The disclosed atomic magnetometer uses very short pulses of light to create the initial polarization of the atoms. The intensity of the light is sufficiently high to polarize the atoms on a time scale much shorter than their Larmor precession period in the magnetic field. In this regime high atomic polarization can be created independently of the orientation of the magnetometer relative to the magnetic field. FIG. 2 shows the maximum polarization that can be achieved as a function of the ratio between the optical pumping rate R and the Larmor precession frequency $\omega$.

In order to achieve high initial atomic polarization in the presence of Earth's magnetic field requires the pumping rate to be 20 to 50 times larger than the Larmor precession frequency, which is typically about $\omega=2\pi\times350$ kHz. Thus the pumping rate R has to equal about $10^8$ sec$^{-1}$.

Such pumping rate exceeds the spontaneous decay rate of atom's excited state, typically about $3\times10^7$ sec$^{-1}$. Therefore, to achieve efficient optical pumping requires a reduction of the excited state lifetime by introducing a quenching gas, typically nitrogen.

Figure 3:
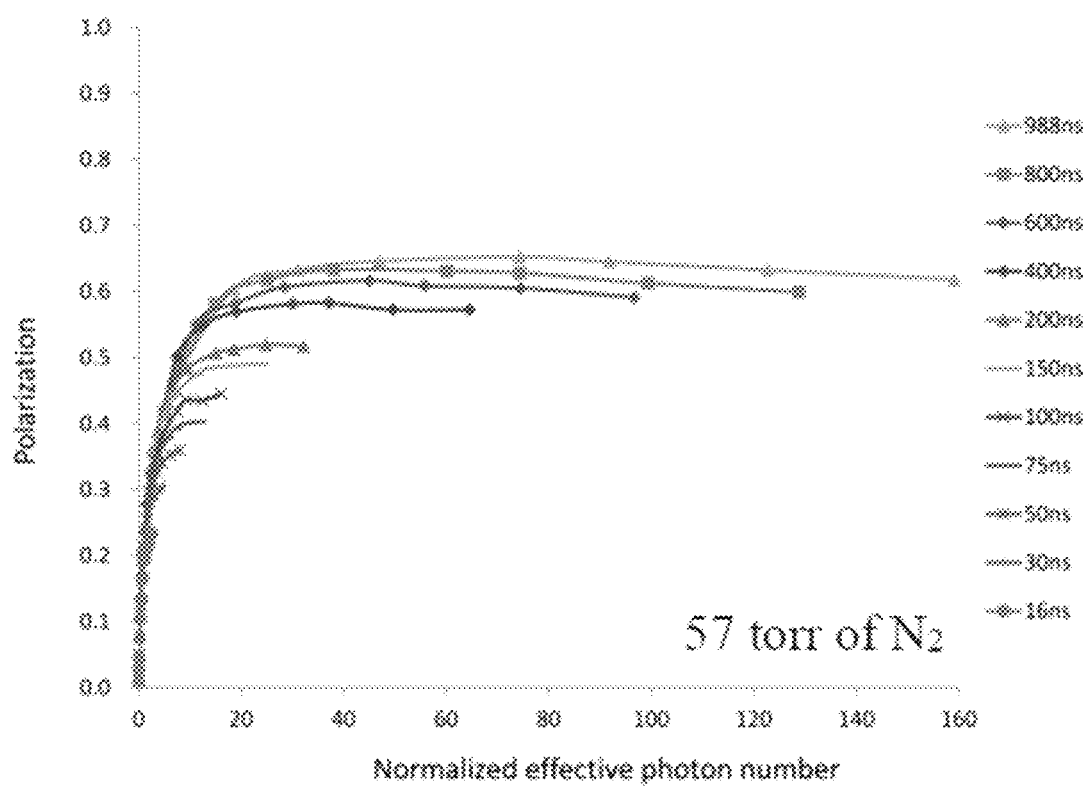
FIGS. 3 and 4 are graphs depicting the maximum achievable spin polarization in Cs atoms as a function of pump pulse length and pressure of $N_2$ quenching gas.
Figure 4:
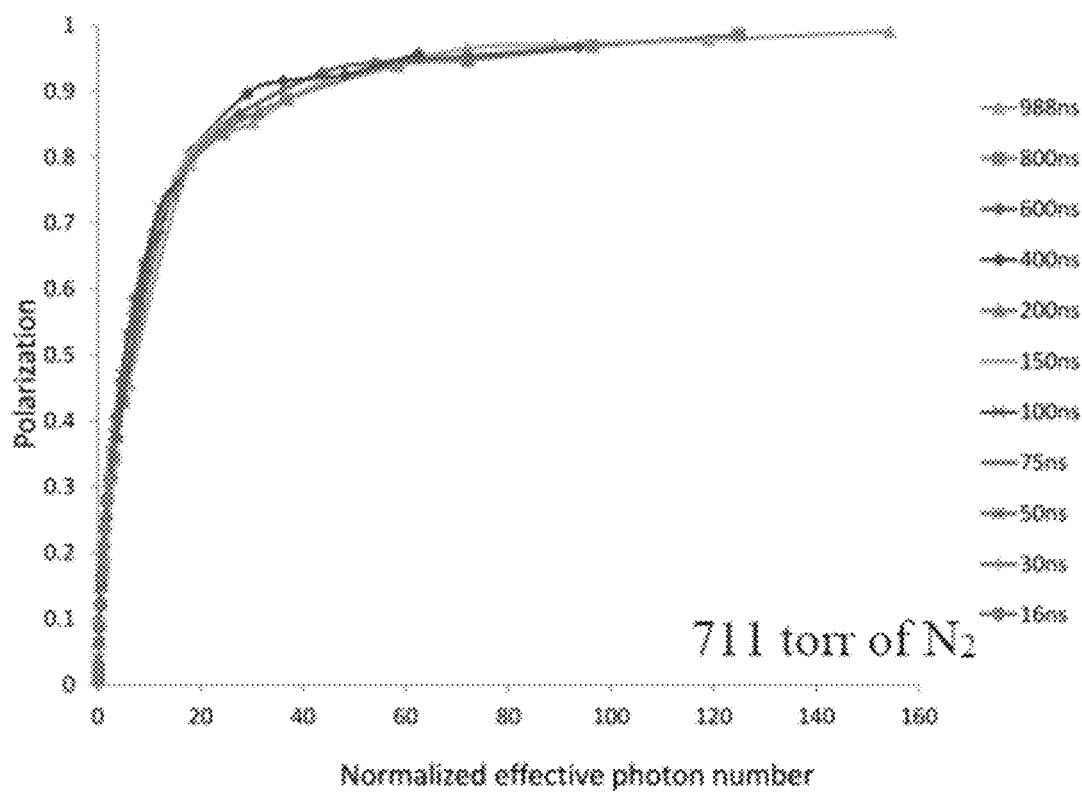

To determine how much buffer gas is sufficient to achieve high spin polarization with a short optical pumping pulse, a series of experiments was run. The results for optical pumping of Cs atoms buffered with $N_2$ are shown in FIGS. 3 and 4. As shown in FIG. 3, a typically used quenching gas pressure of 57 torr is insufficient to achieve high spin polarization. However, as shown in FIG. 4, increasing the buffer gas pressure to 711 torr allows high spin polarization to be achieved in about 500 nanosecond, much shorter than a typical Larmor period of 3-6 microseconds. Thus, high optical polarization of the atoms can be achieved in a time much shorter than the Larmor period. Depending on the alkali metal vapor and quenching gas used, and the desired level of spin polarization, a buffer gas pressure of 100 torr or more may be sufficient. The upper limit of the buffer gas pressure is not particularly limited, although in practice it will be unlikely to exceed 1000 torr. Preferred embodiments utilize a pressure of between 100 and 1000 torr. More preferred embodiments utilize a pressure of between 300 and 760 torr. Still more preferred embodiments utilize a pressure of between 500 and 760 torr. And even more preferred embodiments utilize a pressure of between 700 and 760 torr.

Figure 5:
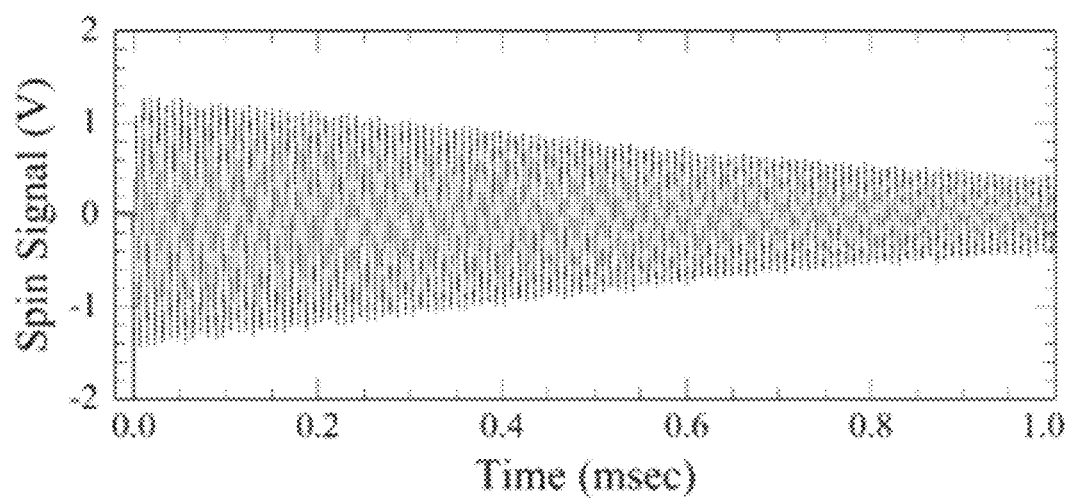
FIG. 5 depicts an example of an experimental Cs spin precession signal after a very short pumping laser pulse.

Referring again to FIG. 1, after initial short optical pumping, the spin precession of the atoms can be monitored for a longer time with a detector (50), a probe laser (60), and, if needed, some additional components and circuitry (55). An example of such precession signal following a short pumping pulse is shown in FIG. 5. The decay of the precession signal is determined by the atomic spin relaxation time as well as by dephasing due to magnetic field gradients. It is not affected by the pump laser (20), which is turned off. The frequency of the spin precession signal can be determined with high precision from the oscillating signal by utilizing, for example, a processor or other component (57) to do a non-linear fitting to a decaying sine wave, by Fourier transform method, lock-in demodulation, or another standard method.

Figure 7:
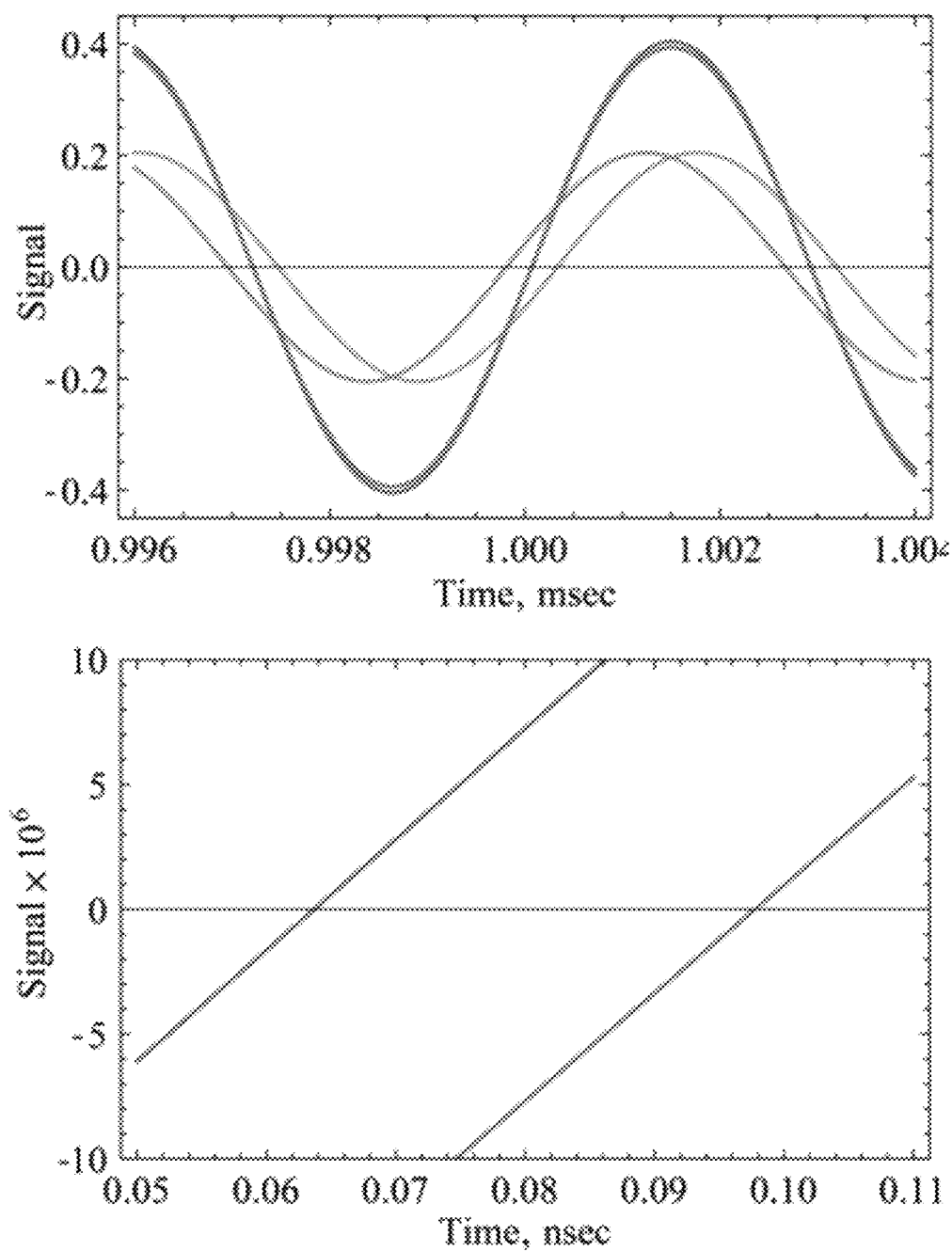
FIG. 7 is a graph depicting the phase of spin precession 1 msec after pump pulse as a function of pump laser orientation relative to the magnetic field, and a zoom in on the signal zero crossing near 1 msec, the time scale is expanded, showing the remaining phase shift.

One of the largest sources of error in alkali metal atomic magnetometers is due to changes in the orientation of the sensor relative to the magnetic field, called the heading error. The heading error can be understood in terms of the magnetic resonance spectrum of alkali metal atoms in a finite magnetic field. Due to the non-linear Zeeman effect, the spectrum consists of many lines, as illustrated in FIG. 7 for Cs atoms in a typical geomagnetic field of 0.5 G. As the direction of the pump laser changes relative to the magnetic field, the relative strength of the resonance lines changes as well. The resonance lines usually cannot be resolved, so the measured frequency is equal to the weighted average of all resonance lines. As can be seen in FIG. 7, the weighted average can shift by as much as 100 Hz, corresponding to a heading error of about 20 nT. Even if the magnetometer orientation relative to magnetic field does not change, the atomic spin polarization in a typical magnetometer can drift due to changes of the laser power, etc., causing significant low-frequency noise.

Optical pumping using fast laser pulses eliminates the heading error and slow drifts in three ways.

First, since the optical pumping pulse is much shorter than Larmor spin precession period, the initial polarization of the atoms after the pulse is independent of the orientation of the magnetic field. In particular, the relative population between the two sets of peaks labeled F=4 and F=3 in FIG. 4, called the hyperfine polarization, will be independent of the magnetic field.

Second, the asymmetry between the peaks within each of the hyperfine states, evident in comparing the lower two panels of FIG. 7, can be eliminated by reversing the sense of circular polarization between successive pumping pulses.

Third, the intensity of the pump laser can be made very high without sacrificing the sensitivity of the magnetometer. In this regime, the spin polarization is saturated very close to unity, so even large changes in the pump intensity or other parameters do not change the polarization of atoms.

Figure 6:
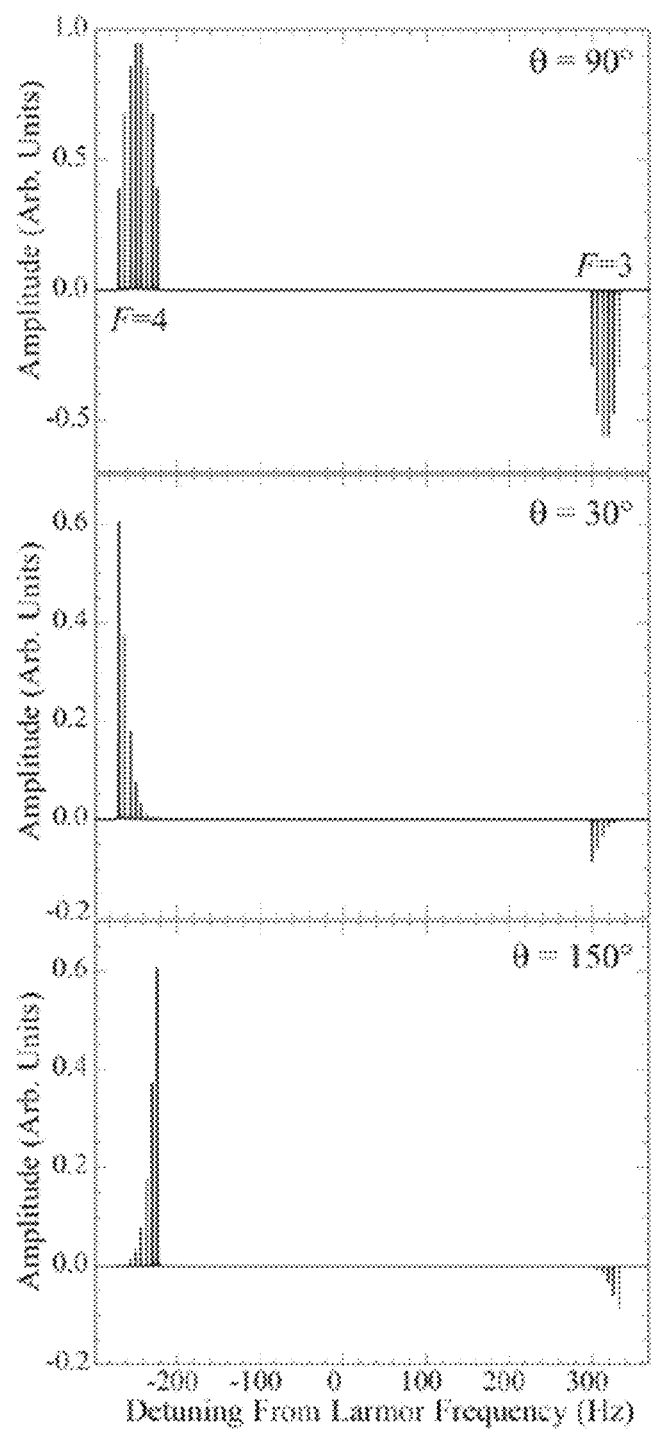
FIG. 6 illustrates a spectrum of Cs atoms in Earth's magnetic field, upper panel with the pump laser perpendicular to the magnetic field, and the lower two panels with the pump laser at 30° and 150° from the field, respectively.
Figure 8:
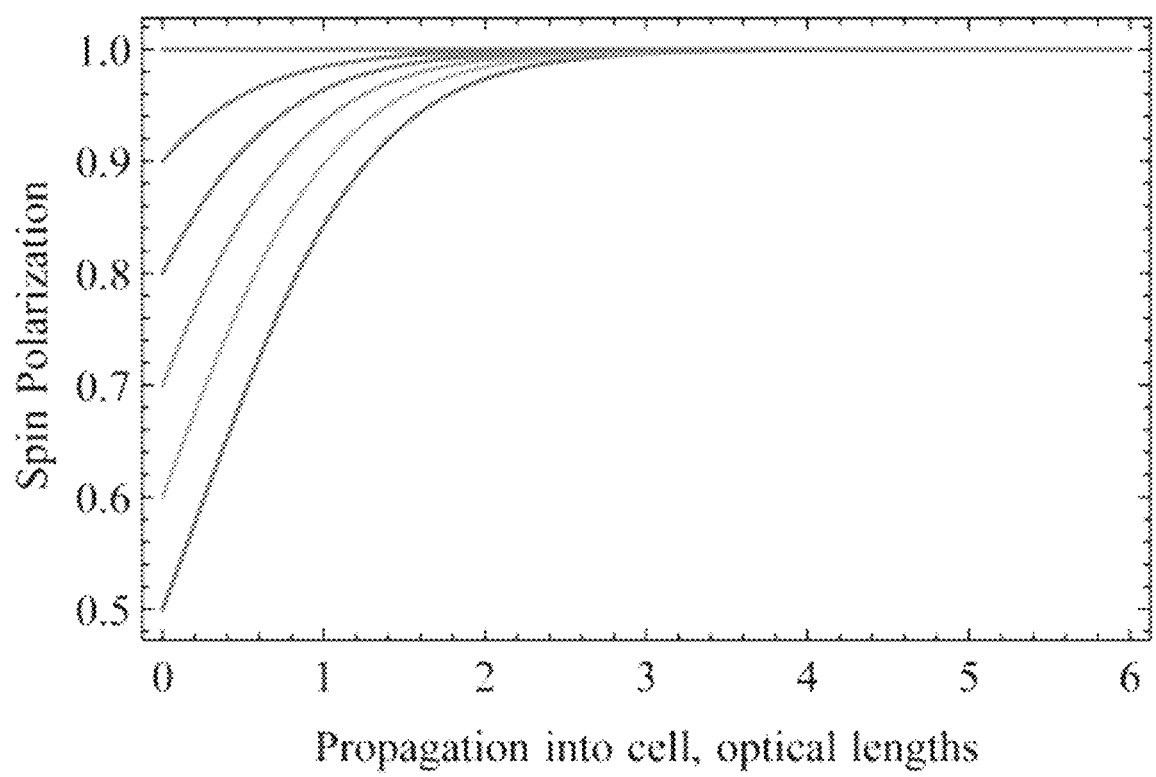
FIG. 8 is a graph depicting the Purification of the polarization of the light as it propagates into optically-thick vapor. Different lines correspond to initial light polarization varying from 50% to 100%.

Each of these methods can be used independently or combined for maximum suppression. The resulting heading error suppression is illustrated in FIG. 8, which shows spin precession signals 1 msec after the pump pulse, similar to the very end of the signal shown in FIG. 6. Different colors correspond to different orientations of the pump laser relative to the magnetic field. However, for any orientation, one can add signals produced with $\sigma^+$ and $\sigma^-$ pump light, for example by alternating the polarization of the pump laser between successive pulses.

The sum of such signals is shown by the red line, which is always very close to the signal obtained with the pump light at 90° to the magnetic field. The small amount of phase shift can be seen on the bottom panel of FIG. 8, where the time scale has been expanded by about a factor of $10^5$. The remaining phase shift is suppressed compared to a typical heading error by the ratio between the Larmor frequency and the hyperfine frequency, on the order of $10^4$. Thus, by using very short pump laser pulses and alternating the polarization of the pump light, one can reduce heading errors and other slow drifts in an alkali metal magnetometer to a level of about 1 pT, similar to the sensitivity of a typical magnetometer.

Figure 9:
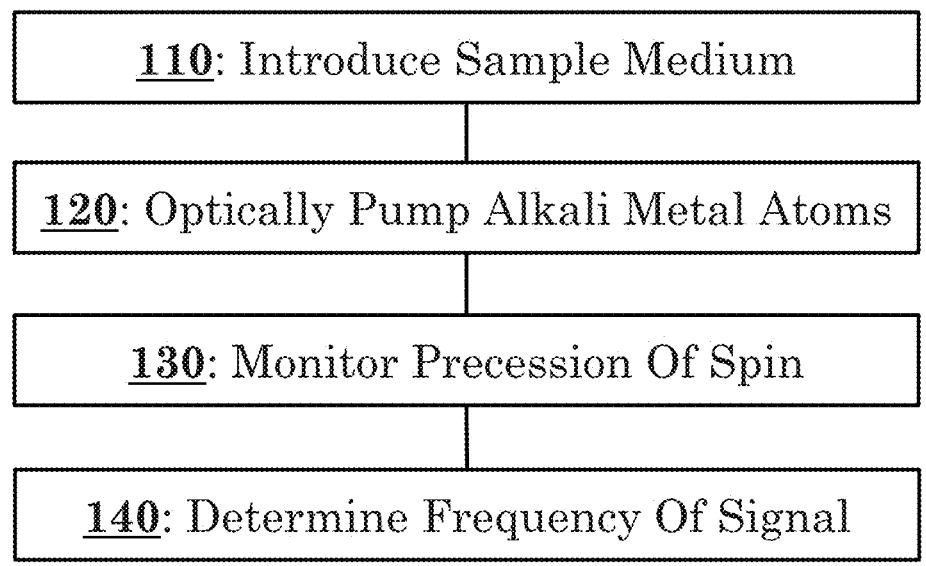
FIG. 9 is a flowchart of a method for measuring magnetic fields.

To improve the suppression of heading error, the polarization of the light may be accurately reversed between $\sigma^+$ and $\sigma^-$. In practice, it is difficult to achieve perfect polarization reversal because of birefringence of the optical components and the cell containing alkali metal atoms. However, high purity circular polarization can be realized inside alkali metal vapor if it optically thick. The optical length, given by $l_{opt}=1/n\sigma$, where n is the density of atoms and $\sigma$ is the absorption cross-section, corresponds to the absorption depth for unpolarized light. Polarized light can propagate much further into the atomic vapor by creating highly polarized alkali metal atoms. FIG. 9 illustrates the purification of circular polarization of the light as it propagates into the vapor. As seen in FIG. 9, the polarization becomes extremely polarized after light has propagated at least 3 optical lengths into the sample chamber/cell. This purification only works in the regime where the pumping rate is very high and the atomic polarization is close to unity, so it is only applicable for pulsed atomic magnetometers.

The sampling rate may also be synchronized with the magnetic field interference frequency. Many sources of magnetic field interference are periodic, for example 60, 50, or 25 Hz noise from power lines, 16.67 Hz noise from railway power systems, or 400 Hz noise from aircraft power systems. The repetition rate for pulsed optical pumping can be chosen to be synchronous with such interference source, thereby eliminating all of its harmonics as well.

Referring to FIG. 2, the process for measuring magnetic fields with a magnetometer generally involves introducing a sample medium to a sample chamber (110), where the sample medium comprises an alkali metal vapor and a quenching gas at a pressure sufficiently high to enable spin polarization of alkali metal atoms to be greater than or equal to a predetermined level. That predetermined level is preferably 90% or greater, more preferably 95% or greater, and even more preferably 98% or greater. The process then involves using the pump laser (20) to optically pumping alkali metal atoms (120), using pulses of at least one of $\sigma^+$ or $\sigma^-$ pump light, where the duration of each pulse is shorter than the Larmor period. The next step is monitoring the precession of spin (130) of the alkali metal atoms with a probe laser (60) and a detector (50) for a period of time. That period of time is preferably on the order of the spin-relaxation time.

The method may also involve determining the frequency of the spin procession signal (140) by non-linear fitting the signal to a decaying sine wave.

Those in the art will understand that a number of variations may be made in the disclosed embodiments, all without departing from the scope of the invention, which is defined solely by the appended claims.

What is claimed is:

1. A magnetometer, comprising:
    a sample chamber;
    a sample medium within the sample chamber, the sample medium comprising an alkali metal vapor and a quenching gas at a pressure greater than 100 torr that enables spin polarization of alkali metal atoms to be greater than or equal to a predetermined level; and
    a pump laser having output directed towards the sample chamber, the laser having an intensity sufficiently high to polarize to a predetermined level in a period of time shorter than the Larmor precession period.

2. The magnetometer of claim 1, wherein the predetermined level is 95% or greater.

3. The magnetometer of claim 1, wherein the sample is optically thick.

4. The magnetometer of claim 3, wherein the laser can propagate at least three optical lengths into the sample medium.

5. The magnetometer of claim 1, further comprising a probe laser configured to produce a probe light directed towards the sample chamber.

6. The magnetometer of claim 5, wherein at least a portion of the pump light and at least a portion of the probe light are collinear.

7. The magnetometer of claim 1, wherein the pump laser is adapted to alternate the polarization of the pump laser between successive pulses.

8. The magnetometer of claim 1, wherein the plurality of pulses are produced at a rate synchronous with repetitive magnetic field noise.

9. The magnetometer of claim 8, wherein the rate is selected from the group consisting of 16.7 Hz, 25 Hz, 50 Hz, 60 Hz, and 400 Hz.

10. The magnetometer of claim 1, wherein the pump laser is adapted to produce a plurality of pulses of at least one of $\sigma^+$ or $\sigma^-$ pump light.

11. A method for using a magnetometer to reduce heading error, comprising the steps of:
    providing a magnetometer according to claim 1;
    optically pumping alkali metal atoms using pulses of at least one of $\sigma^+$ or $\sigma^-$ pump light, the duration of each pulse being shorter than the Larmor period and the intensity of each pulse is sufficient to polarize atoms to a predetermined level of polarization; and
    monitoring precession of spin of the alkali metal atoms with a probe laser and a detector for a period of time, the detector generating a detector signal, the detector signal having reduced heading error.

12. The method of claim 11, wherein the predetermined level is 95% or greater.

13. The method of claim 11, further comprising passing each pulse through a sample chamber containing the alkali metal vapor, wherein the sample chamber is configured such that the pump light propagates through the alkali metal vapor a sufficient number of optical lengths so as to allow at least some purification of circular polarization.

14. The method of claim 13, wherein the pump light propagates at least 3 optical lengths through the alkali metal vapor.

15. The method of claim 11, wherein the pulses of at least one of $\sigma^+$ or $\sigma^-$ pump light is produced by alternating the polarization of the pump laser between successive pulses.

16. The method of claim 11, further comprising generating a spin-procession signal.

17. The method of claim 16, wherein the period of time is approximately the spin-relaxation time.

18. The method of claim 16, further comprising determining the frequency of the spin procession signal by non-linear fitting the signal to a decaying sine wave.

* * * * *